United States Patent
Tan et al.

(10) Patent No.: US 12,165,878 B2
(45) Date of Patent: Dec. 10, 2024

(54) SEMICONDUCTOR MASK RESHAPING USING A SACRIFICIAL LAYER

(71) Applicant: Lam Research Corporation, Fremont, CA (US)

(72) Inventors: Zhongkui Tan, Fremont, CA (US); Xiaofeng Su, Portland, OR (US); Hua Xiang, Dublin, CA (US); Ce Qin, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 338 days.

(21) Appl. No.: 17/310,772

(22) PCT Filed: Feb. 26, 2020

(86) PCT No.: PCT/US2020/019828
§ 371 (c)(1),
(2) Date: Aug. 23, 2021

(87) PCT Pub. No.: WO2020/176582
PCT Pub. Date: Sep. 3, 2020

(65) Prior Publication Data
US 2022/0076962 A1    Mar. 10, 2022

Related U.S. Application Data

(60) Provisional application No. 62/811,337, filed on Feb. 27, 2019.

(51) Int. Cl.
*H01L 21/311*    (2006.01)
*H01J 37/32*    (2006.01)
*H01L 21/3213*    (2006.01)

(52) U.S. Cl.
CPC .. *H01L 21/31144* (2013.01); *H01L 21/31116* (2013.01); *H01L 21/31122* (2013.01);
(Continued)

(58) Field of Classification Search
CPC ......... H01L 21/31144; H01L 21/31116; H01L 21/31122; H01L 21/32136; H01L 21/32139
See application file for complete search history.

(56) References Cited

U.S. PATENT DOCUMENTS 6,030,881 A    2/2000 Papasouliotis et al.
6,033,952 A  * 3/2000 Yasumura ............... H01L 28/82
                                                257/E21.012
(Continued)

FOREIGN PATENT DOCUMENTS

CN    101473426 A    7/2009
CN    102844856 A    12/2012
(Continued)

OTHER PUBLICATIONS

Chinese Decision of Final Rejection dated Mar. 17, 2021 issued in Application No. CN 201611177683.3.
(Continued)

*Primary Examiner* — Monica D Harrison
*Assistant Examiner* — Woo K Lee
(74) *Attorney, Agent, or Firm* — Weaver Austin Villeneuve & Sampson LLP

(57) ABSTRACT

Provided herein are methods and related apparatus for mask reconstruction in an etch process. The methods involve depositing a sacrificial layer on the mask layer. The sacrificial layer may be used to protect portions of the mask layer during reshaping by inhibiting etching of or deposition on the mask layer position on the mask layer. Following mask reshaping, the sacrificial layer may be removed using the same etch process that is used to etch the target material.

19 Claims, 5 Drawing Sheets

(52) U.S. Cl.
CPC .. *H01L 21/32136* (2013.01); *H01L 21/32139* (2013.01); *H01J 37/321* (2013.01); *H01J 2237/3321* (2013.01); *H01J 2237/334* (2013.01)

(56) References Cited

U.S. PATENT DOCUMENTS

| | | | |
|---|---|---|---|
| 6,261,723 | B1 | 7/2001 | George et al. |
| 7,901,736 | B2 | 3/2011 | Maula et al. |
| 8,722,543 | B2 | 5/2014 | Belen et al. |
| 9,034,748 | B2 | 5/2015 | Baiocco et al. |
| 9,922,839 | B2 | 3/2018 | Wise et al. |
| 10,062,602 | B2 | 8/2018 | Posseme et al. |
| 10,438,807 | B2 | 10/2019 | Wise et al. |
| 10,825,680 | B2 | 11/2020 | Kabansky et al. |
| 2003/0211752 | A1 | 11/2003 | Rattner et al. |
| 2004/0043581 | A1 | 3/2004 | Lin et al. |
| 2005/0103748 | A1 | 5/2005 | Yamaguchi et al. |
| 2006/0199082 | A1 | 9/2006 | Flanigan et al. |
| 2006/0205220 | A1 | 9/2006 | Hudson et al. |
| 2007/0049017 | A1 | 3/2007 | Hsieh |
| 2008/0045022 | A1 | 2/2008 | Kurihara et al. |
| 2009/0275202 | A1 | 11/2009 | Tanaka et al. |
| 2009/0286400 | A1 | 11/2009 | Heo et al. |
| 2011/0045672 | A1 | 2/2011 | Srinivasan et al. |
| 2011/0207323 | A1 | 8/2011 | Ditizio |
| 2014/0030444 | A1 | 1/2014 | Swaminathan et al. |
| 2014/0120727 | A1 | 5/2014 | Subramanian et al. |
| 2014/0187035 | A1 | 7/2014 | Posseme et al. |
| 2014/0213060 | A1 | 7/2014 | Kao et al. |
| 2016/0379824 | A1 | 12/2016 | Wise et al. |
| 2017/0178899 | A1 | 6/2017 | Kabansky et al. |
| 2018/0061663 | A1 | 3/2018 | Chandrashekar et al. |
| 2018/0190503 | A1 | 7/2018 | Wise et al. |
| 2018/0233357 | A1 | 8/2018 | Kabansky et al. |
| 2019/0198338 | A1 | 6/2019 | Kim et al. |
| 2019/0348292 | A1 | 11/2019 | Dutta et al. |
| 2021/0391181 | A1* | 12/2021 | Chang ............... H01L 21/31144 |
| 2023/0343593 | A1 | 10/2023 | Nagabhirava et al. |

FOREIGN PATENT DOCUMENTS

| | | | |
|---|---|---|---|
| CN | 104347490 | A | 2/2015 |
| EP | 3258317 | A1 | 12/2017 |
| JP | 2000003844 | A | 1/2000 |
| JP | 2000228503 | A | 8/2000 |
| JP | 2000331992 | A | 11/2000 |
| JP | 2006290701 | A | 10/2006 |
| KR | 100679449 | B1 | 2/2007 |
| KR | 20070103847 | A | 10/2007 |
| KR | 20080018110 | A | 2/2008 |
| KR | 20140016201 | A | 2/2014 |
| KR | 20190085654 | A | 7/2019 |
| TW | 201415551 | A | 4/2014 |
| TW | 201821637 | A | 6/2018 |
| WO | WO-2004034445 | A2 | 4/2004 |

OTHER PUBLICATIONS

Chinese First Office Action dated Aug. 27, 2019 issued in Application No. CN 201611177683.3.
Chinese Fourth Office Action dated Aug. 20, 2021 issued in Application No. CN 201611177683.3.
Chinese Notice of Allowance dated Jan. 29, 2022 issued in Application No. CN 201611177683.3.
Chinese Second Office Action dated Apr. 17, 2020 issued in Application No. CN 201611177683.3.
Chinese Third Office Action dated Oct. 26, 2020 issued in Application No. CN 201611177683.3.
Gordon et al, (2003) "A Kinetic Model for Step Coverage by Atomic Layer Deposition in Narrow Holes or Trenches", Chemical Vapor Deposition, vol. 9, No. 2, pp. 73-78.
International Preliminary Report on Patentability dated Sep. 10, 2021 issued in Application No. PCT/US2020/019828 ISA/KR.
International Search Report and Written Opinion dated Jun. 19, 2020 issued in Application No. PCT/US2020/019828 ISA/KR.
Notice of Allowance dated Jun. 18, 2020 issued in U.S. Appl. No. 15/952,634.
Petrillo et al., (2013) "Resist process applications to improve EUV patterning," Proc. of SPIE, 8679:867911-1 to 867911-12.
Taiwanese First Office Action dated Dec. 27, 2019 issued in Application No. TW 105119663.
Taiwanese First Office Action dated Jun. 18, 2020 issued in Application No. TW 105141672.
Taiwanese Second Office Action dated Nov. 19, 2020 issued in Application No. TW 105141672.
TW Office Action dated Nov. 22, 2021, in Application No. TW105141672 with English translation.
US Final Office Action, dated Aug. 24, 2017, issued in U.S. Appl. No. 15/189,317.
US Final Office Action, dated Dec. 13, 2017, issued in U.S. Appl. No. 15/061,359.
US Final Office Action, dated Jun. 27, 2019, issued in U.S. Appl. No. 15/952,634.
US Final Office Action, dated Mar. 13, 2017, issued in U.S. Appl. No. 15/061,359.
US Final Office Action, dated Mar. 30, 2020, issued in U.S. Appl. No. 15/952,634.
US Notice of Allowance, dated Jun. 13, 2019, issued in U.S. Appl. No. 15/909,814.
US Notice of Allowance, dated Nov. 9, 2017, issued in U.S. Appl. No. 15/189,317.
US Office Action, dated Dec. 11, 2018, issued in U.S. Appl. No. 15/909,814.
US Office Action, dated Dec. 16, 2019, issued in U.S. Appl. No. 15/952,634.
US Office Action, dated Jul. 19, 2017, issued in U.S. Appl. No. 15/061,359.
US Office Action, dated Mar. 16, 2017, issued in U.S. Appl. No. 15/189,317.
US Office Action, dated Mar. 8, 2019, issued in U.S. Appl. No. 15/952,634.
US Office Action, dated Oct. 21, 2016, issued in U.S. Appl. No. 15/061,359.
International Preliminary Report on Patentability dated Sep. 9, 2022, in PCT Application No. PCT/US2021/019245.
KR Office Action dated Jul. 10, 2023, in application No. KR 10-2016-0078587 with English Translation.
KR Office Action dated Oct. 27, 2023 in KR Application No. 10-2016-0172666, with English Translation.
TW Office Action dated Sep. 19, 2023, in application No. TW109106198 with English translation.
Xu, P., et al., "Theoretical Study of the Binding of Silane ($SiH_4$) with Borane ($BH_3$), Diborane ($B_2H_6$), and Boron Trichloride ($BCl_3$): The Role of Core-Electron Correlation," Journal of Physical Chemistry A, 2012, vol. 116, pp. 11668-11672.
CN Office Action dated Jun. 28, 2024 in CN Application No. 202080030905.7 with English translation.

* cited by examiner

SEMICONDUCTOR MASK RESHAPING USING A SACRIFICIAL LAYER

INCORPORATED BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Plasma etch of a target material to form a patterned structure uses a patterned mask layer to etch the underlying target material. Mask selectivity, which is the ratio of the etch rate between the target material and the mask layer, is an important factor in an etch process, as the mask should be etched at a lower rate than the target material. The thickness and shape of the mask layer are also important factors that affect etching of the target material. The thickness of the mask layer will be defined in part by the mask selectivity, and the shape of the mask layer contributes to ion scattering, sputtering, and re-deposition behavior.

Etching of the target material may also remove mask material or otherwise deform the mask layer. The interaction of the etch chemistry and mask material may change the patterned mask layer's thickness and shape before the target layer is sufficiently etched. Changes in the patterned mask layer's shape can affect the etch process and cause an undesirable effect on the final etched features of the target material if the etching process continues with the deformed mask.

SUMMARY

Disclosed herein are methods and systems of reshaping a mask layer during an etch process for a target material. A sacrificial layer is used to reshape the mask layer by inhibiting the deposition or etch of the mask material. The sacrificial layer is then removed during the subsequent etch of the target material.

In one aspect of the embodiments herein, a method of reshaping a mask layer is provided, the method including: providing to a process chamber a substrate including a patterned mask layer disposed on a target layer to be etched, the target layer including a first material having a first etch rate with regard to a first etch chemistry, and the patterned mask layer including a second material having a second etch rate with regard to the first etch chemistry, wherein the first etch rate is higher than the second etch rate; depositing on the patterned mask layer a sacrificial layer including a third material, the third material having a third etch rate with regard to the first etch chemistry that is higher than the second etch rate; etching the patterned mask layer using a second etch chemistry, wherein the sacrificial layer inhibits etching of the patterned mask layer covered by the sacrificial layer.

In various implementations, the first material and the third material are similar. In some such cases the third material has a chemical composition that is at least 50%, 75%, or 90% the same by atomic percent as the first material.

In some embodiments, the third etch rate is the same as the first etch rate within 50%, inclusive, or 10%, inclusive. In some cases the second material has an etch rate with regard to the second etch chemistry that is higher than the etch rates of the first material and the third material with regard to the second etch chemistry.

In certain embodiments, second material is deposited on the patterned mask layer prior to depositing the sacrificial layer. In some embodiments, second material is deposited on the patterned mask layer after depositing the sacrificial layer.

In some embodiments, the second material is a silicon oxide-based or silicon nitride-based material and the first material and third material are silicon-based materials. In other embodiments, the second material is a silicon oxynitride-based material and the first material and third material are carbon-based materials. In some implementations the second material is a carbon-based material and the first material and third material are a silicon oxide-based or silicon oxynitride-based materials. In various implementations the second material is a silicon-based material and the first material and third material are a silicon oxide-based or silicon nitride-based materials. In various embodiments the second material is a silicon oxide-based or silicon nitride-based material and the first material and third material are tungsten-based materials.

In certain embodiments, the sacrificial layer is deposited by a plasma enhanced chemical vapor deposition (PECVD) process. In some embodiments, the sacrificial layer is deposited by a high density plasma chemical vapor deposition (HDP-CVD) process. In some embodiments, the depositing and etching are done within the same process chamber.

These and other features of the disclosed embodiments will be described in detail below with reference to the associated drawings.

DETAILED DESCRIPTION

Figure 1:
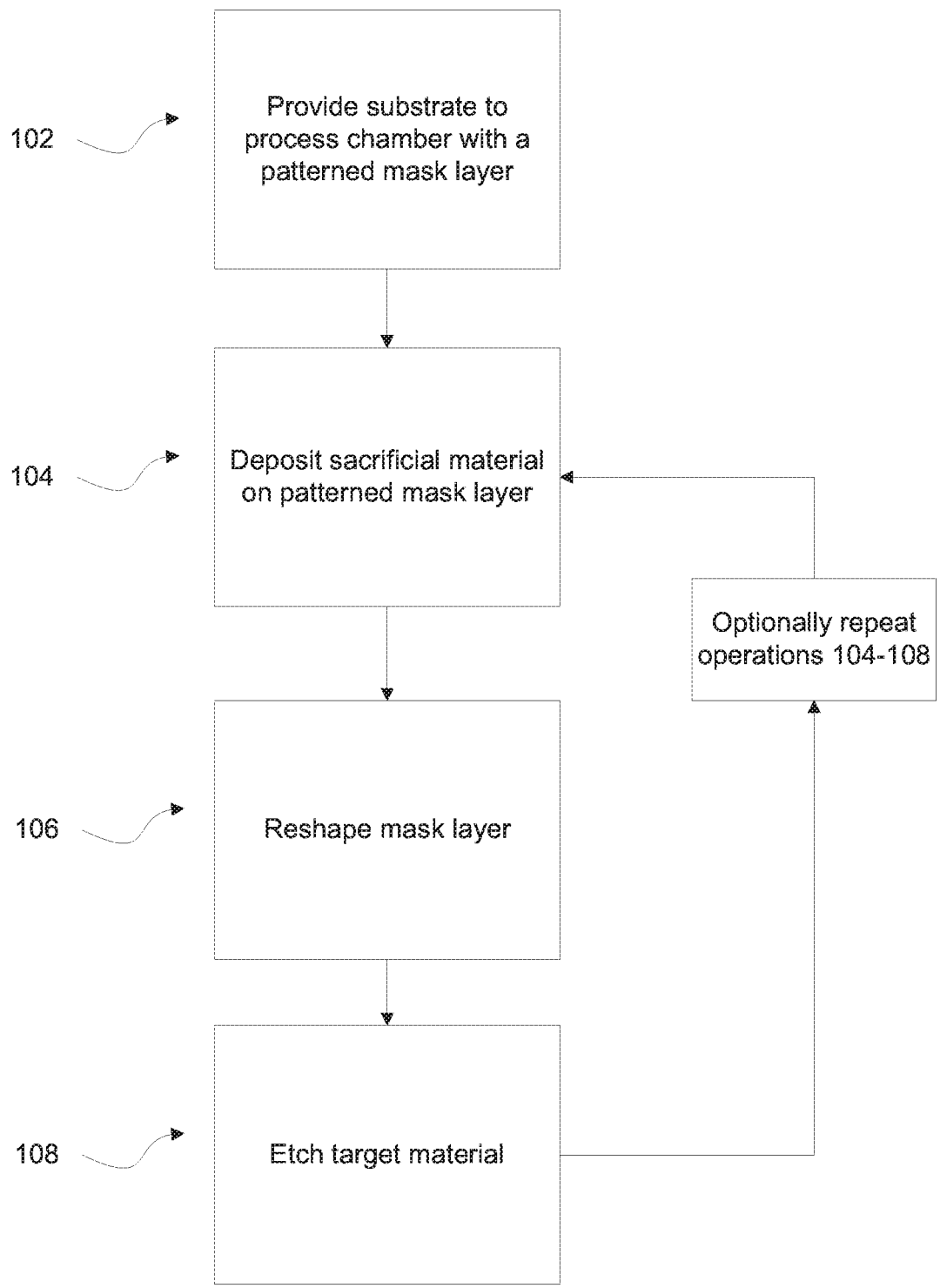
FIG. 1 presents a flow diagram of an operation for one example embodiment.

In the following description, numerous specific details are set forth to provide a thorough understanding of the presented embodiments. Embodiments disclosed herein may be practiced without some or all of these specific details. In other instances, well-known process operations have not been described in detail to not unnecessarily obscure the disclosed embodiments. Further, while the disclosed embodiments will be described in conjunction with specific embodiments, it will be understood that the specific embodiments are not intended to limit the disclosed embodiments.

Plasma etch of a target material uses a patterned mask layer on top of the target material. A patterned mask layer may also be referred to as a mask layer, patterned mask, or mask. Materials that form the mask layer can be deposited using a variety of techniques that allow for specific patterning. The mask layer acts as a shield to the layer beneath it during an etch process, while the etch process removes material that is not protected by the mask layer. After the target material is sufficiently etched, the mask layer may be removed in a subsequent process, leaving the target material etched in accordance with the pattern.

An important property of the mask is its etch selectivity with respect to the target material. Etch selectivity is the ratio of the etch rates between two different materials for a given etch chemistry. In the present discussion, etch selectivity may be the ratio between the target material and the mask material for a particular etch chemistry. A mask may have one etch rate for a given etch chemistry, and a higher or lower etch rate for a different etch chemistry. The target material also has varying etch rates for each etch chemistry. In an etch process the target material generally has a higher etch rate than the mask material for a selected etch chemistry, i.e., the target material has a high etch selectivity with respect to the mask material. High etch selectivity allows a thin mask layer to be used when etching a much thicker target layer, as the mask material is etched at a much slower rate than the target material. Etch selectivity may be 5:1, 10:1, 20:1, or higher for a particular combination of mask material, target material, and etch chemistry.

During the etch process, the mask layer may deform in various ways. In some cases, etching causes the mask layer to become faceted, which may cause ion scattering that results in undesirable etching of the side walls of the structure being etched. In some cases the mask layer will be sufficiently etched to expose the underlying layer, which will then be etched if the process continues.

The etch process may also cause sputter re-deposition of mask material. As the mask material is etched, the material that is removed may re-deposit back onto the substrate in a manner that is undesirable. Mask material may re-deposit in a non-selective manner, increasing the mask critical dimension and shrinking the space above a feature to be etched. This clogs the gap and inhibits ions from properly etching the target material, or causes uneven etching of the target material. Improper etching of features can lead to local critical dimension variability, line edge roughness, insufficient feature depth, and decreased process yield.

The mask layer may be reshaped to avoid undesirable results and improve yield. Some solutions to reshape mask layers include selective etching of the mask layer and deposition of additional material, which may or may not be the same material as the mask material. Etching the mask layer may decrease the mask critical dimension but will reduce the mask thickness and cause selectivity challenges in that there may be insufficient mask thickness to complete the etch, which is undesirable. Mask material deposition will increase the mask thickness, but may also increase the mask critical dimension, which is undesirable.

An alternative approach to develop a reshaped mask layer is to deposit a sacrificial layer on the mask layer. The sacrificial layer may be used to protect the mask layer during reshaping by inhibiting etching or deposition of the mask layer. Directional deposition of the sacrificial layer may be used to protect the top or sidewalls of the mask layer while permitting etching of the exposed mask. A sacrificial material has high etch selectivity with respect to the mask for at least one etch chemistry. Following mask reshaping, the sacrificial layer is removed using the same etch process that is used to etch the target material.

FIG. 1 provides a process flow diagram for performing operations of a method in accordance with disclosed embodiments. The method shown in FIG. 1 may be performed as part of a process to etch a target material. It begins with an operation 102, in which a semiconductor substrate including a target layer and patterned mask layer is provided to a processing chamber. The semiconductor substrate may be in the process chamber from a previous operation or may be introduced to the process chamber.

The semiconductor substrate may be a silicon or other semiconductor wafer, e.g., a 200-mm wafer, a 300-mm wafer, or a 450-mm wafer, including wafers having one or more layers of material, such as dielectric, conducting, or semi-conducting material, deposited thereon. In some embodiments, the semiconductor substrate includes a blanket layer of silicon, such as amorphous silicon, or a blanket layer of germanium. The semiconductor substrate may also include a patterned mask layer previously deposited and patterned on the semiconductor substrate.

The mask layer may be any appropriate material including organic or inorganic hard masks. Examples of organic masks include doped or undoped amorphous carbon (also known as ashable hard masks or AHMs) and organo-siloxane materials. Examples of inorganic mask materials include poly- and amorphous silicon (poly-Si, a—Si), silicon oxide (SiO), silicon nitride (SiN), silicon oxynitrides (SiON), silicon carbonitride (SiCN), titanium nitride (TiN), tungsten (W) and other metal that can be selectively removed after feature etching. A mask may be doped, with an example being a boron-doped AHM. In some embodiments, the mask may be a metal mask (MHM), with examples including metals (e.g., aluminum (Al), metal nitrides (e.g., TiN and tantalum nitride (TaN), tungsten (W) and metal oxides (e.g., alumina ($Al_2O_3$)). In some embodiments, the mask may be a ceramic hard mask (CHM).

In some embodiments, the layers on the substrate may be patterned. Substrates may have "features" such as via or contact holes, which may be characterized by one or more of narrow and/or reentrant openings, constrictions within the feature, or high aspect ratios. The feature may be formed in one or more of the above described layers by etching the substrate. One example of a feature is a hole or via in a semiconductor substrate or a layer on the substrate. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

The processing chamber itself may be an etch chamber in which a plasma etch of the underlying material is performed. Examples of chambers are described below with reference to FIGS. 4 and 5.

In operation 104 a sacrificial material is deposited on the patterned mask layer. The sacrificial material is generally deposited "preferentially" with respect to a particular area of the patterned mask layer. For example, in some embodiments the sacrificial material is preferentially deposited on top of the features of the patterned mask layer, with significantly less sacrificial material deposited on the sidewalls of the patterned mask layer. The choice of where to deposit sacrificial material depends on how the reshaped mask layer is being developed, as discussed further below. Further discussion of deposition of sacrificial material is below.

In operation 106 the mask layer is reshaped. In some embodiments, operation 106 involves exposing the mask layer and sacrificial material to a plasma etch. The previously deposited sacrificial material protects the mask layer during the etch process. The sacrificial material acts as a separate mask to the mask layer being etched; inhibiting the etch of covered areas of the mask layer. An etch chemistry used to etch the mask layer should be selective to the mask with respect to the sacrificial material such that there is a higher etch rate for the mask than for the sacrificial material. The etch process will remove mask material where the sacrificial material was not deposited. Thus, if the sacrificial material covers substantially the top of the patterned mask and not the sidewalls, the etch process will remove sidewall mask material, but will not reduce mask thickness.

In some embodiments, operation 106 involves depositing additional mask material, increasing either the thickness or critical dimension of the mask. Critical dimension of the mask is the width of the individual mask features. Small or reduced critical dimensions of the mask can lead to faceting of the mask features and deflection of etch ions, while large or increased critical dimension of the mask can cause clogging at the top of a feature being etched. In some embodiments, the additional mask material may be deposited by an ion driven deposition process. This can involve applying a voltage bias to the substrate during the plasma deposition process such that additional mask material deposits on the sacrificial layer. Some mask material may also deposit at the bottom of the target layer feature; the thickness of any such material is small enough to not substantially affect the subsequent target etch.

In alternate embodiments, the additional mask material is deposited by a selective deposition process, where the additional mask material is chemically selective to the mask with respect to the sacrificial layer. The mask material does not deposit, or deposits significantly less, on the sacrificial material, increasing the mask dimension only where the sacrificial material is not deposited. Thus, if the sacrificial material covers substantially the top of the patterned mask and not the sidewalls, the deposition process will increase the sidewall thickness and critical dimension, but will not increase mask thickness.

Following reshaping of the mask layer, in operation 108 the target layer is etched. In some embodiments the target material and the sacrificial layer have a similar or same etch rate for an etch chemistry used in an etch process for the target material. A similar etch rate for the target layer and sacrificial layer is an etch selectivity of the sacrificial layer with respect to the target layer of 1:1-2:1. In some embodiments, the etch rate of the sacrificial layer is within 50% of the etch rate for the target layer, or within 90% of the etch rate for the target layer. In some embodiments, this permits the sacrificial material to be removed without a separate etch step for the sacrificial layer; it is removed as an effect of etching the target layer. This reduces the total time to complete the etch of the target layer. In some embodiments, a separate etch may be performed to remove the sacrificial layer prior to operation 108. When the sacrificial material is removed, mask material that may have deposited on it during operation 106 may be removed. The additional mask material may be thin enough that it is removed during the target etch. Alternatively, a separate etch process may be performed.

In some embodiments the sacrificial material is deposited and the mask layer reshaped after some etching of the target layer has already occurred, and the mask layer has deformed. In other embodiments, the sacrificial material is deposited and mask layer reshaped before any etching of the target layer. In some embodiments, the reshape process occurs cyclically, depositing sacrificial material and reshaping the mask layer after one or more etches of the target layer. Operations 104-108 may be repeated as necessary until the target layer has been sufficiently etched.

In some embodiments additional mask material is deposited before depositing any sacrificial material in operation 104. This may increase the thickness and critical dimension of the mask layer. Where mask thickness is to be increased during the reshaping, this intermediate step allows the mask thickness to be increased before depositing the sacrificial material. The sacrificial material then may act as a shield to maintain the mask thickness during a mask reshape in operation 106.

In some embodiments the sacrificial material that is deposited has etch byproducts or residue that is similar to the target layer. As described above, the process of FIG. 1 may omit a distinct etch of the sacrificial material, with the sacrificial material removed during etch of the target layer. By appropriately choosing the sacrificial material, the byproducts and residue generated by the etch of the sacrificial material are the same or similar as those of the target layer and may be removed by the same process. This may save time and reduce defects compared to using a different material that would be removed by a third etch chemistry or a separate cleaning operation.

In some embodiments, the sacrificial material is the same material as the target material, or is similar to the target material. Similarity is defined as sharing at least 50% chemical composition by molar percent. In some embodiments, the materials share at least 75% chemical composition by molar percent, or at least 90% chemical composition by molar percent. For example, if the target material is doped silicon, the sacrificial material could be doped or undoped silicon.

Table 1, below, shows examples of sacrificial layers that may be used for particular target and mask layer combinations, and the related etch chemistries.

| Target Layer | Mask Layer | Sacrificial Layer | Target Layer/ Sacrificial Layer Etch Chemistry | Mask Layer Etch Chemistry |
| --- | --- | --- | --- | --- |
| Crystalline Si, a-Si, polySi | $SiO_2$, SiN | a-Si | HBr, $NF_3$, $O_2$ | $SF_6$, $CF_4$, $NF_3$, $CH_2F_2$, $CHF_3$, $CH_3F$ |
| C | $SiO_2$, SiN, SiON or Si | C | $O_2$, $SO_2$, COS (Carbonyl sulfide) | $SF_6$, $CF_4$, $NF_3$, $CH_2F_2$, $CHF_3$, $CH_3F$ |
| $SiO_2$, SiON | C | $SiO_2$ | $SF_6$, $CF_4$, $NF_3$, $CH_2F_2$, $CHF_3$, $CH_3F$ | $O_2$, $SO_2$, COS |
| W | $SiO_2$, SiN | W | $Cl_2$, $NF_3$, $CF_4$, $SF_6$, $O_2$ | $SF_6$, $CF_4$, $NF_3$, $CH_2F_2$, $CHF_3$, $CH_3F$ |
| $SiO_2$, SiN | Crystalline Si, a-Si, polySi | $SiO_2$, SiN | $SF_6$, $CF_4$, $NF_3$, $CH_2F_2$, $CHF_3$, $CH_3F$ | HBr, $NF_3$, $O_2$ |

In some embodiments, both the sacrificial material and the target material are silicon oxide-based materials. In some embodiments, both the sacrificial material and the target material are silicon nitride-based materials. In some embodiments, both the sacrificial material and the target material are silicon oxynitride-based materials. In some embodiments, both the sacrificial material and the target material are carbon-based materials. In some embodiments, both the sacrificial material and the target material are elemental metal-based materials. In some embodiments, both the sacrificial material and the target material are tungsten-based materials. In some embodiments, both the sacrificial material and the target material are dielectric-based materials. In some embodiments, both the sacrificial material and the target material are oxide-based materials. In some embodiments, both the sacrificial material and the target material are nitride-based materials.

As used herein, a material is "based" on an element or compound if that element or compound represents at least 50% of the material by molar percent. In some embodiments, both materials may have at least 75% or 90% by molar percent of the same element or compound.

One example of the method of FIG. 1 is high aspect ratio carbon etch. A target material is amorphous carbon, and a mask material is $SiO_2$, SiN, SiON or Si. The typical target layer thickness is 100 nm to 3 um, while mask layer thickness is 20 nm-200 nm, with a feature space critical dimension of 20 nm-300 nm. Selectivity of 10:1 or higher is needed. The shape of the mask has a large influence on profile control, etch front depth variation, and mask open dimple local critical dimension uniformity and circularity. Due to the high aspect ratio of the mask width compared to the feature depth, a high ion energy etch is used, and mask faceting is a general side effect due to a sputtering of mask material. A faceted mask will cause a larger "bow" shape due to ion scattering, while re-deposition of the sputtered mask to adjacent feature will cause mask critical dimension growth (and space critical dimension shrinkage), which will lead to "clogging" of the top opening of the feature. Any random clogged space will cause not-open issue, local CD variability, and line edge roughness/circularity degradation for a Line/Space or hole/pillar pattern.

A sacrificial layer including amorphous carbon is deposited on the mask. Then, the mask is etched to trim the sidewalls of the mask. The result is reduced mask critical dimension, allowing the target layer etch to continue with a reduced chance of defects.

Figure 2:
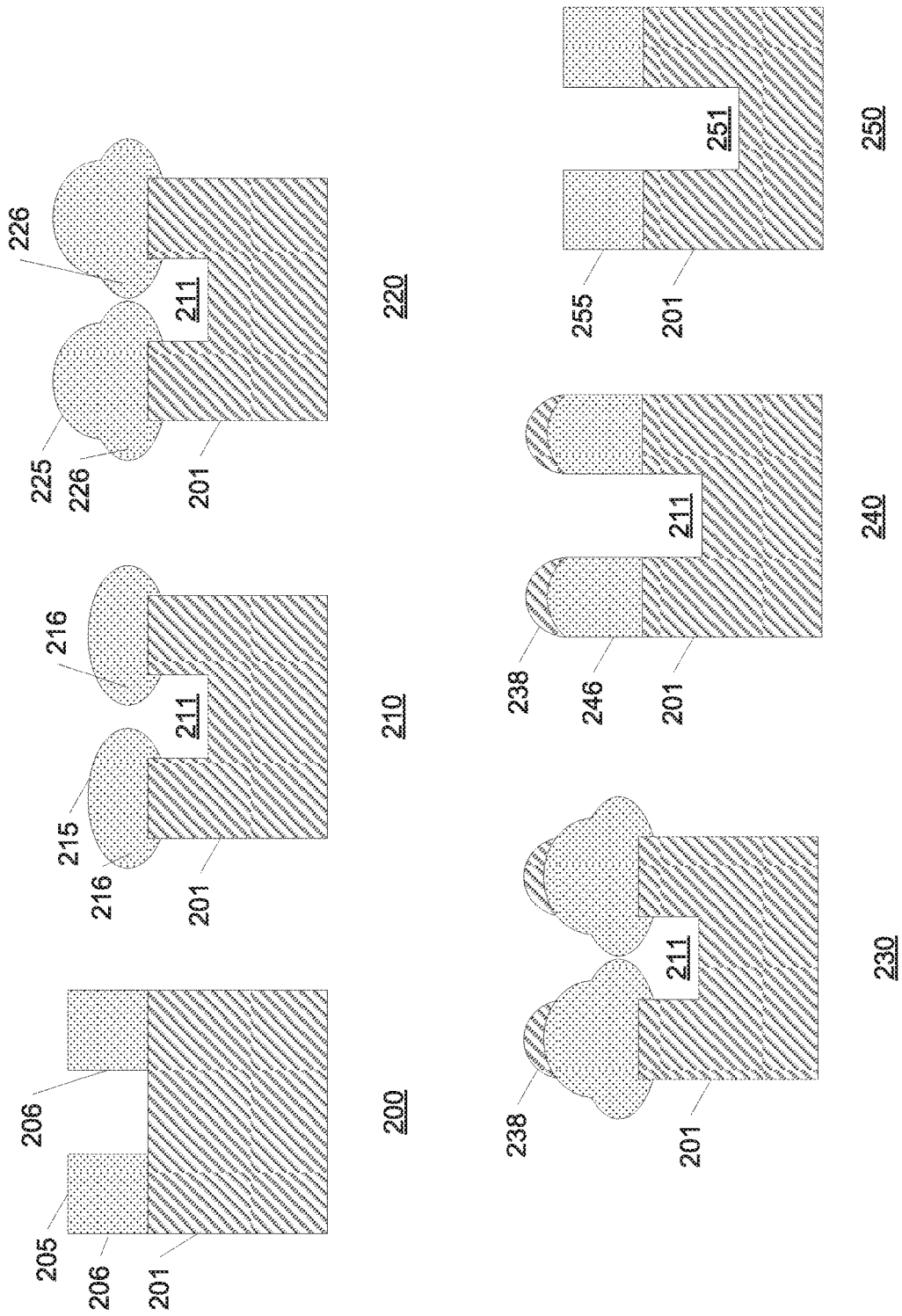
FIG. 2 presents an illustration of one example embodiment.

Particular examples of the method of FIG. 1 are discussed below with reference to FIGS. 2 and 3. First, FIG. 2 presents an example embodiment of a side view of a semiconductor substrate during reshaping of a mask during an etch process. At operation 200 a target layer 201 with a patterned mask layer 205 thereon is provided to a processing chamber. (As described above, being provided to a process chamber can include the substrate being introduced to the chamber as well as simply remaining there from a previous operation.) At this stage the patterned mask layer 205 has a uniform shape resulting from methods of creating a patterned mask layer known to those with skill in the art. In particular, mask sidewalls 206 have a vertical profile.

At operation 210 the target layer 201 has been etched to a depth 211. Because of the high etch selectivity of the patterned mask layer 205 with respect to the target layer 201, the target layer 201 is etched at a high rate, while the patterned mask layer 205 is etched at a much lower rate. The etch process has also deformed the patterned mask into mask shape 215, resulting in a reduced thickness as well as a mushroom effect that has increased the mask critical dimension resulting in mask sidewalls 216. The mushroom effect of the mask shape 215 and mask sidewalls 216, or necking of the feature space, inhibits the etch process from etching within the well, which is undesirable.

In some embodiments additional mask material is deposited on the mask shape 215 to increase its thickness in operation 220. Due to the deformation of the patterned mask layer 205, the mask thickness may be insufficient to provide the desired etch selectivity. The thickness can be increased by depositing additional mask material, but the material will deposit conformally, increasing the size of the mushroom and further increasing the necking problem. Deposition of additional mask material creates a built-up mask 225, which has increased the mask critical dimension even further, resulting in mask sidewalls 226. In some embodiments operation 220 could be omitted, following operation 210 with operation 230.

In operation 230, a sacrificial layer 238 is deposited. The sacrificial layer 238 can be preferentially deposited so that there is greater deposition at the top of the built-up mask 225 than the sides. Because the mask material has a high etch selectivity with respect to the sacrificial material, the sacrificial layer 238 will protect and preserve the patterned mask's thickness while the etch process trims the sides of the built-up mask 225. In some embodiments a sacrificial material used for the sacrificial layer 238 is the same material comprising target layer 201. In other embodiments, the sacrificial material may not be the same material but does have similar etch by-products as the target layer 201. In embodiments where operation 220 is omitted, the sacrificial layer 238 would be deposited on mask shape 215.

In operation 240 the built-up mask 225 is etched. Mask sidewalls 246 of the patterned mask layer have been etched back to the desired critical dimension. Due to the low etch selectivity of the sacrificial layer 238 with respect to the mask material, the sacrificial layer 238 has been maintained along with the thickness of the built-up mask 225. In embodiments where operation 220 is omitted, the mask shape 215 will be etched instead.

At operation 250 the etch of the substrate layer continues to a second depth 251. Because the sacrificial material 238 has a similar etch rate and residue as the target layer 201 being etched, the sacrificial material 238 can be removed as a consequence of continuing to etch the target layer 201. A separate process is not needed to remove the sacrificial material or any residues that result from it being etched, as the residue from the sacrificial material will be of the same type as the substrate layer being etched. The mask is also reshaped to reshaped mask 255, which is the same as or similar to the patterned mask layer 205 in operation 200. In embodiments where operation 220 is omitted, the reshaped mask 255 may have a lower thickness than the patterned mask layer 205 in operation 200.

In some embodiments operations 210-250 may be repeated multiple times. As a feature is being etched the mask layer may deform and be fixed as described above, and after etching to an additional depth the mask layer will again deform and again be fixed. Operations 210-250 may be repeated as necessary until the feature is sufficiently etched.

Figure 3:
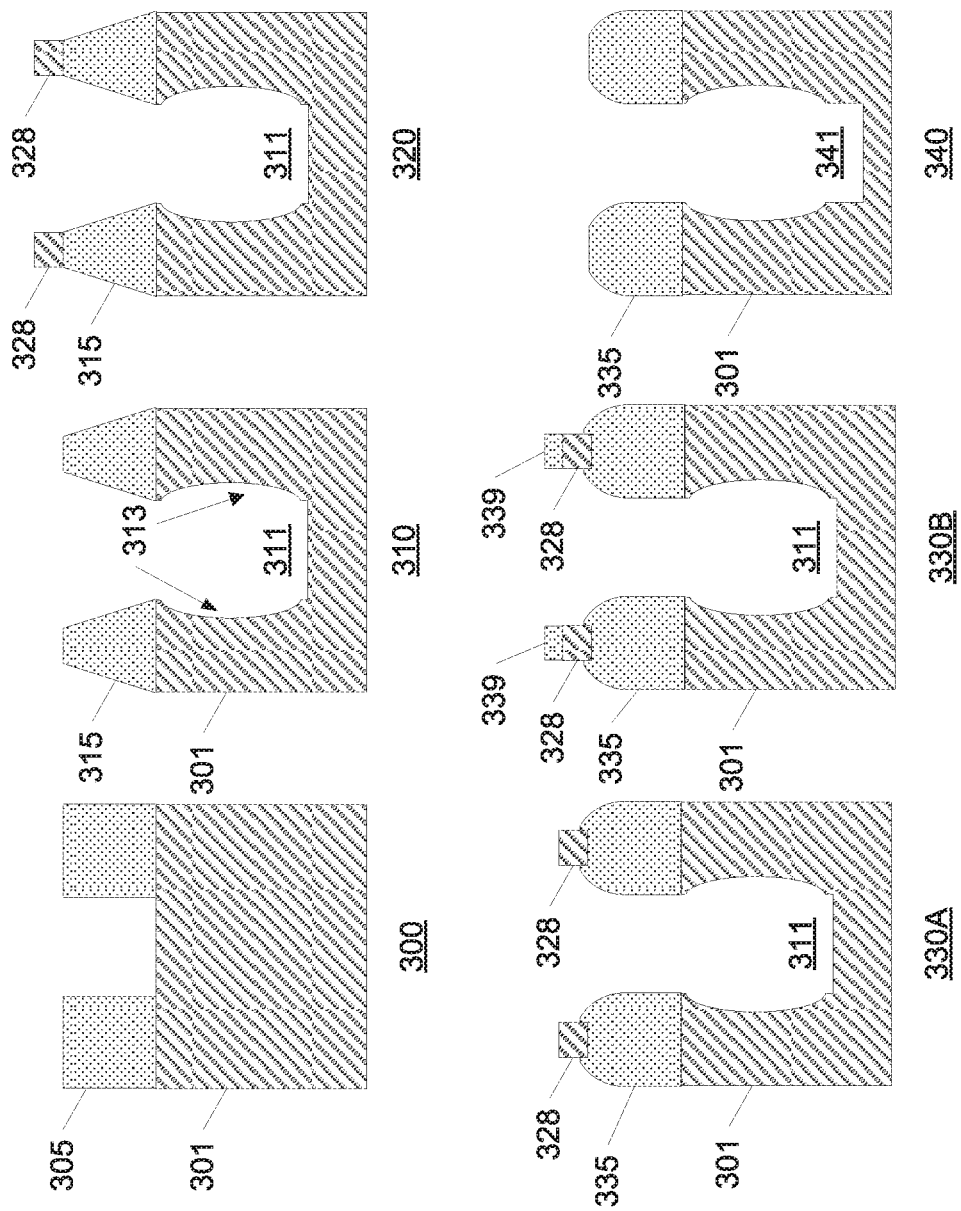
FIG. 3 presents another illustration of an example embodiment.

FIG. 3 presents another embodiment of the disclosures herein regarding faceting of a patterned mask layer. Similar to above, at operation 300 a semiconductor substrate is provided into a processing chamber. This time, at operation 310 the target material has been etched to a depth 311, and the patterned mask layer has been directionally etch at the top corners and sidewall, leading to a faceted mask 315.

Facets are undesirable because they may cause a deflection of ions during an etch process. The deflected ions may impinge on a sidewall of a feature being etched, etching the sidewall. Sidewalls 313 represent what may happen during an etch process with a faceted mask. Sidewalls 313 are bowed inward, increasing the volume of the feature being etched as well as reducing the material separating features. Bowed sidewalls may affect downstream operations, requiring additional material to fill the etched feature than originally planned. Bowed sidewalls may also reduce the ability of an insulating material to separate features electrically, inhibiting proper functioning and reducing the overall yield of a wafer. The degree of sidewall etch may vary depending on the degree of faceting of the mask.

In some embodiments the sidewalls are not etched during operation 310. Sidewall etch is shown in the present example to demonstrate what may happen if the etch process continues after the mask becomes faceted. In some embodiments the sidewalls are not etched in operations 310-340, as the mask is altered in accordance with the present disclosure before sidewall etching occurs.

At operation 320 a sacrificial layer 328 is deposited. The sacrificial layer 328 can be preferentially deposited so that there is greater deposition at the top of the patterned mask layer than the sides. The sacrificial layer 328 acts as a barrier to deposition of additional mask material. The mask material will not deposit on top of the sacrificial layer 328, or else will be removed when the underlying sacrificial layer 328 is removed.

Operations 330A and 330B are alternative methods of depositing additional mask material. In some embodiments either operation 330A or 330B will be performed, while in other embodiments both operations may be performed. In operation 330A additional mask material is deposited by a selective deposition process that deposits selectively on faceted mask 315 to form mask 335. The sacrificial layer 328 inhibits deposition on top of faceted mask 315, where it covers the patterned mask layer, resulting in deposition only on the sidewalls of faceted mask 315. This increases the critical dimension of the mask without also increasing its thickness.

In operation 330B additional mask material is deposited by an ion-driven deposition process to form mask 335. The ion-driven deposition process will deposit on the sacrificial layer 328, creating a cap 339. The ion-driven deposition preferentially deposits on the top surface of the sacrificial layer 328; deposition conditions can be controlled to prevent encapsulation of the sacrificial layer 328. The sacrificial layer 328 acts as an intermediary layer between the cap 339 and the mask 335.

In operation 340 the target material is etched to a second depth 341. Sacrificial layer 328 is removed by the etch of the target material due to a similar etch rate and residue. In some embodiments, a separate process is not used to remove the sacrificial layer, reducing complexity and increasing processing time. Cap 339 may be thin enough to be removed in the target etch or may be removed by a separate process. The remaining mask 335 continues to act as a protective layer over the target material, as it did in operation 300.

In some embodiments operations 310-340 may be repeated multiple times. As a feature is being etched the mask layer may deform and be fixed as described above, and after etching to an additional depth the mask layer will again deform and again be fixed. Operations 310-340 may be repeated as necessary until the feature is sufficiently etched.

Deposition of the Sacrificial Material

Deposition of a sacrificial material may be a plasma deposition including a plasma-enhanced chemical vapor deposition (PECVD) process or a high density plasma chemical vapor deposition (HDP-CVD) process according to various embodiments. In embodiments in which the etch process is performed in a capacitively-coupled plasma etching apparatus, a PECVD process may be advantageously performed, and in embodiments in which the etch process is performed in an inductively-coupled plasma etching apparatus, a HDP-CVD process may be advantageously performed.

Various process conditions may be tuned to provide directional deposition during the plasma deposition such that the material does not deposit on the mask sidewalls. Residence time (flow rates) and plasma power during deposition also be appropriately adjusted to increase directional deposition.

In depositing a silicon-based sacrificial material, any appropriate silicon-containing precursor may be used including silanes (e.g., $SiH_4$), polysilanes ($H_3Si$—$(SiH_2)_n$—$SiH_3$) where $n \geq 1$, organosilanes, halogenated silanes, and aminosilanes. Organosilanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like, may be used. A halogenated silane contains at least one halogen group and may or may not contain hydrogens and/or carbon groups. Examples of halogenated silanes are iodosilanes, bromosilanes, chlorosilanes and fluorosilanes. Specific chlorosilanes are tetrachlorosilane ($SiCl_4$), trichlorosilane ($HSiCl_3$), dichlorosilane ($H_2SiCl_2$), monochlorosilane ($ClSiH_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri—and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiary-butylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like.

The deposited films may be amorphous, with film composition depending on the particular precursor and co-reactants used, with organosilanes resulting a—SiC:H films and aminosilanes resulting in a—SiN:H or a—SiCN:H films.

In depositing carbon-based films, any appropriate carbon-containing precursor may be used. In some embodiments, a hydrocarbon precursor of the formula $C_xH_y$, wherein X is an integer between 2 and 10, and Y is an integer between 2 and 24, may be used. Examples include methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$).

In some embodiments, the sacrificial material may be doped or include a material such as boron or phosphorous. Additional dopants include arsenic, sulfur and selenium. In this manner, etch selectivity to a mask layer may be improved. For example, for doped dielectrics (particularly silicon dioxide based dielectrics), the process gas may include a dopant precursor such as a boron-containing gas, a phosphorus-containing gas, a carbon-containing gas, or a mixture thereof. In a specific embodiment, the gas includes one or more boron-containing reactants and one or more phosphorus-containing reactants and the dielectric film includes a phosphorus- and boron-doped silicon oxide glass (BPSG). Examples of suitable boron and phosphorus precursor gases include borane ($BH_3$), diborane ($B_2H_6$), and triborane ($B_3H_7$) and phosphine ($PH_3$). Examples of arsenic-containing, sulfur-containing, and selenium-containing gases include hydrogen selenide ($H_2Se$), hydrogen arsenide ($AsH_3$), and hydrogen sulfide ($H_2S$).

If the sacrificial material is to contain an oxynitride (e.g., silicon oxynitride), then the deposition gas may include a nitrogen-containing reactant such as $N_2$, $NH_3$, $NO$, $N_2O$, and mixtures thereof. Examples of deposited films include boron-doped silicon, silicon boride, silicon boride carbon, and the like.

Metal-containing films may also be deposited. Examples of metal-containing films that may be formed include oxides and nitrides of aluminum, titanium, hafnium, tantalum, tungsten, manganese, magnesium, strontium, etc., as well as elemental metal films. Example precursors may include metal alkylamines, metal alkoxides, metal alkylamides, metal halides, metal β-diketonates, metal carbonyls, organometallics, etc. Appropriate metal-containing precursors will include the metal that is desired to be incorporated into the film. For example, a tantalum-containing layer may be deposited by reacting pentakis(dimethylamido)tantalum with ammonia or another reducing agent as an auxiliary reactant. Further examples of metal-containing precursors that may be employed include trimethylaluminum, tetraethoxytitanium, tetrakis-dimethyl-amido titanium, hafnium tetrakis(ethylmethylamide), bis(cyclopentadienyl)manganese, and bis(n-propylcyclopentadienyl)magnesium, etc.

Example

The following example is provided to further illustrate aspects of various embodiments. This example is provided to exemplify and more clearly illustrate aspects and is not intended to be limiting.

A carbon-based sacrificial material may be used to protect a $SiO_2$ mask for etch of a carbon-based target layer. An example deposition involves using a transformer coupled plasma (TCP) etch reactor for a HDP-CVD process using a $CH_3F/CH_2F_2/O_2$ process gas. Pressure is 30 mT, plasma power is 2500 W, with a bias voltage of 50 V. The mask modification may involve etching using a $CF_4/CHF_3/O_2$ etchant gas in the TCP reactor. Pressure is 10 mT, plasma power is 600 W, with a bias voltage of 400 V.

Mask deposition may be performed by an ion-driven deposition or a selective deposition process. An example ion-driven deposition involves using a transformer coupled plasma (TCP) etch reactor for a HDP-CVD process using a $SiCl_4/C_{12}/O_2$ process gas. Pressure is 50 mT, plasma power is 2500 W, with a bias voltage of 50V. An example selective deposition involves using a transformer coupled plasma (TCP) etch reactor for a HDP-CVD process using a $SiCl_4/C_{12}/O_2$ process gas. Pressure is 8 mT, plasma power is 325 W, with a bias voltage of 100V.

Apparatus

In some embodiments, the directional deposition is performed in an etching apparatus. For example, the methods described above may be performed in an inductively-coupled plasma etching apparatus or a capacitively-coupled plasma etching apparatus.

Figure 4:
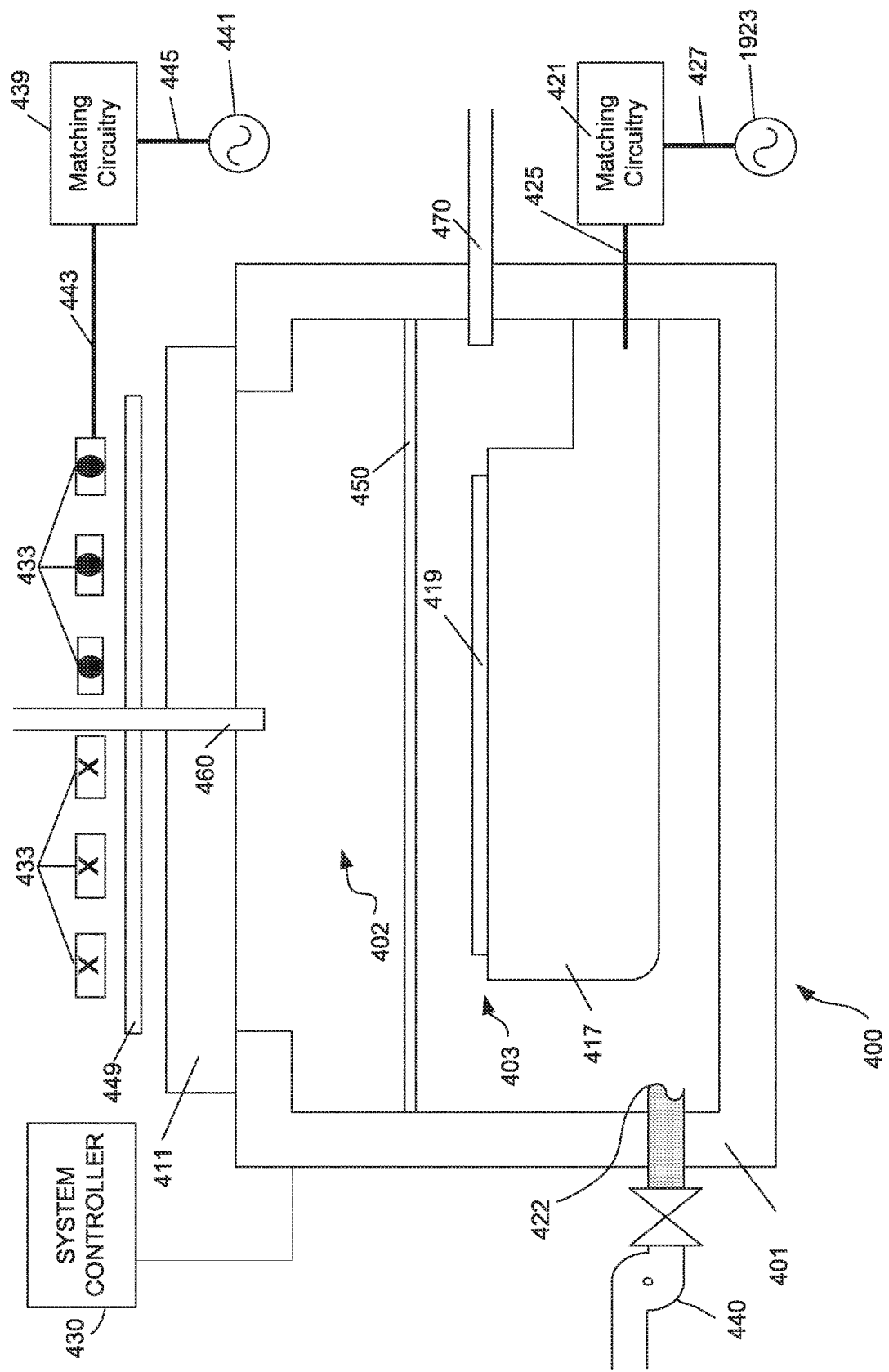
FIGS. 4 and 5 are schematic diagrams of examples of process chambers for performing methods in accordance with disclosed embodiments.

FIG. 4 schematically shows a cross-sectional view of an inductively coupled plasma etching apparatus 400 in accordance with certain embodiments herein. A Kiyo TM reactor, produced by Lam Research Corp. of Fremont, CA, is an example of a suitable reactor that may be used to implement the techniques described herein. The inductively coupled plasma etching apparatus 400 includes an overall etching chamber structurally defined by chamber walls 401 and a window 411. The chamber walls 401 may be fabricated from stainless steel or aluminum. The window 411 may be fabricated from quartz or other dielectric material. An optional internal plasma grid 450 divides the overall etching chamber into an upper sub-chamber 402 and a lower sub-chamber 403. In most embodiments, plasma grid 450 may be removed, thereby utilizing a chamber space made of sub-chambers 402 and 403. A chuck 417 is positioned within the lower sub-chamber 403 near the bottom inner surface. The chuck 417 is configured to receive and hold a semiconductor wafer 419 upon which the etching process is performed. The chuck 417 can be an electrostatic chuck for supporting the wafer 419 when present. In some embodiments, an edge ring (not shown) surrounds chuck 417, and has an upper surface that is approximately planar with a top surface of a wafer 419, when present over chuck 417. The chuck 417 also includes electrostatic electrodes for chucking and dechucking the wafer. A filter and DC clamp power supply (not shown) may be provided for this purpose. Other control systems for lifting the wafer 419 off the chuck 417 can also be provided. The chuck 417 can be electrically charged using an RF power supply 423. The RF power supply 423 is connected to matching circuitry 421 through a connection 427. The matching circuitry 421 is connected to the chuck 417 through a connection 425. In this manner, the RF power supply 423 is connected to the chuck 417.

A coil 433 is positioned above window 411. The coil 433 is fabricated from an electrically conductive material and includes at least one complete turn. The exemplary coil 433 shown in FIG. 5 includes three turns. The cross-sections of coil 433 are shown with symbols, and coils having an "X" extend rotationally into the page, while coils having a "e" extend rotationally out of the page. An RF power supply 441 is configured to supply RF power to the coil 433. In general, the RF power supply 441 is connected to matching circuitry 439 through a connection 445. The matching circuitry 439 is connected to the coil 433 through a connection 443. In this manner, the RF power supply 441 is connected to the coil 433. An optional Faraday shield 449 is positioned between the coil 433 and the window 411. The Faraday shield 449 is maintained in a spaced apart relationship relative to the coil 433. The Faraday shield 449 is disposed immediately above the window 411. The coil 433, the Faraday shield 449, and the window 411 are each configured to be substantially parallel to one another. The Faraday shield may prevent metal or other species from depositing on the dielectric window of the plasma chamber.

Process gases may be supplied through a main injection port 460 positioned in the upper chamber and/or through a side injection port 470, sometimes referred to as an STG. A vacuum pump, e.g., a one or two stage mechanical dry pump and/or turbomolecular pump 440, may be used to draw process gases out of the process chamber 424 and to maintain a pressure within the process chamber 400 by using a closed-loop-controlled flow restriction device, such as a throttle valve (not shown) or a pendulum valve (not shown), during operational plasma processing.

During operation of the apparatus, one or more reactant gases may be supplied through injection ports 460 and/or 470. In certain embodiments, gas may be supplied only through the main injection port 460, or only through the side injection port 470. In some cases, the injection ports may be replaced by showerheads. The Faraday shield 449 and/or optional grid 450 may include internal channels and holes that allow delivery of process gases to the chamber. Either or both of Faraday shield 449 and optional grid 450 may serve as a showerhead for delivery of process gases.

Radio frequency power is supplied from the RF power supply 441 to the coil 433 to cause an RF current to flow through the coil 433. The RF current flowing through the coil 433 generates an electromagnetic field about the coil 433. The electromagnetic field generates an inductive current within the upper sub-chamber 402. During an etch process, the physical and chemical interactions of various generated ions and radicals with the wafer 419 selectively etch features of the wafer.

If the plasma grid is used such that there is both an upper sub-chamber 402 and a lower sub-chamber 403, the inductive current acts on the gas present in the upper sub-chamber 402 to generate an electron-ion plasma in the upper sub-chamber 402. The optional internal plasma grid 450 limits the amount of hot electrons in the lower sub-chamber 403. In some embodiments, the apparatus is designed and operated such that the plasma present in the lower sub-chamber 403 is an ion-ion plasma.

Both the upper electron-ion plasma and the lower ion-ion plasma may contain positive and negative ions, through the ion-ion plasma will have a greater ratio of negative ions to positive ions. Volatile etching byproducts may be removed from the lower-subchamber 403 through port 422.

The chuck 417 disclosed herein may operate at elevated temperatures ranging between about 30° C. and about 250° C. The temperature will depend on the etching process operation and specific recipe. In some embodiments, the chamber 401 may also operate at pressures in the range of between about 1 mTorr and about 95 mTorr. In certain embodiments, the pressure may be higher as disclosed above.

Chamber 401 may be coupled to facilities (not shown) when installed in a clean room or a fabrication facility. Facilities include plumbing that provide processing gases, vacuum, temperature control, and environmental particle control. These facilities are coupled to chamber 401, when installed in the target fabrication facility. Additionally, chamber 401 may be coupled to a transfer chamber that allows robotics to transfer semiconductor wafers into and out of chamber 401 using typical automation.

In some embodiments, a system controller 430 (which may include one or more physical or logical controllers) controls some or all of the operations of an etching chamber. Controllers are described further below.

Figure 5:
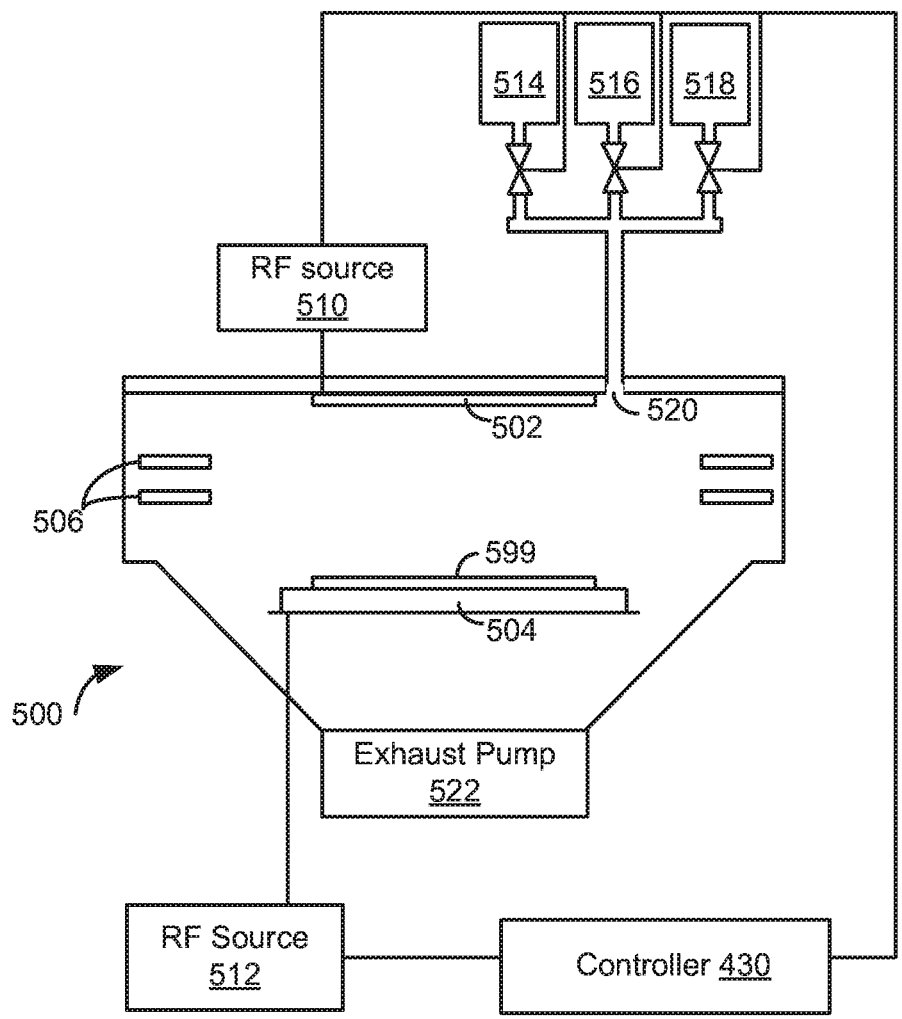

FIG. 5 is a schematic depiction of an example of a capacitively-coupled plasma etching apparatus according to various embodiments. A plasma etch chamber 500 includes an upper electrode 502 and a lower electrode 504 between which a plasma may be generated. A substrate 599 having a patterned hard mask film thereon and as described above may be positioned on the lower electrode 504 and may be held in place by an electrostatic chuck (ESC). Other clamping mechanisms may also be employed. The plasma etch chamber 500 may include plasma confinement rings 506 that keep the plasma over the substrate and away from the chamber walls. Other plasma confinement structures, e.g. as a shroud that acts an inner wall, may be employed. In some embodiments, the plasma etch chamber may not include any such plasma confinement structures.

In the example of FIG. 5, the plasma etch chamber 500 includes two RF sources with RF source 510 connected to the upper electrode 502 and RF source 512 connected to the lower electrode 504. Each of the RF sources 510 and 512 may include one or more sources of any appropriate frequency including 2 MHz, 13.56 MHz, 27 MHz, and 60 MHz. Gas may be introduced to the chamber from one or more gas sources 514, 516, and 518. For example, the gas source 514 may include deposition or etching gases as described above. Gas may be introduced to the chamber through inlet 520 with excess gas and reaction byproducts exhausted via exhaust pump 522.

One example of a plasma etch chamber that may be employed is a 2300® Flex™ reactive ion etch tool available from Lam Research Corp. of Fremont, CA. Further description of plasma etch chambers may be found in U.S. Pat. Nos. 6,841,943 and 8,552,334, which are herein incorporated by reference for all purposes.

Returning to FIG. 5, a controller 430 may be connected to the RF sources 510 and 512 as well as to valves associated with the gas sources 514, 516, and 518, and to the exhaust pump 522. In some embodiments, the controller 430 controls all of the activities of the plasma etch chamber 500.

The following discussion of a controller 430 may be applied as appropriate to the controller 430 in FIGS. 4 and 5. The controller 430 may execute control software stored in mass storage device, loaded into a memory device, and executed on a processor. Alternatively, the control logic may be hard coded in the controller 430. Alternatively, the control logic may be hard coded in the controller 430. Applications Specific Integrated Circuits, Programmable Logic Devices (e.g., field-programmable gate arrays, or FPGAs) and the like may be used for these purposes. In the following discussion as well as in the discussion of the controller in FIG. 6, wherever "software" or "code" is used, functionally comparable hard coded logic may be used in its place.

The control software may include instructions for controlling the timing of application and/or magnitude of any one or more of the following chamber operational conditions: the mixture and/or composition of gases, chamber pressure, chamber temperature, wafer/wafer support temperature, the bias applied to the wafer, the frequency and power applied to coils or other plasma generation components, wafer position, wafer movement speed, and other parameters of a particular process performed by the tool. Control software may be configured in any suitable way. For example, various process tool component subroutines or control objects may be written to control operations of the process tool components necessary to carry out various process tool processes. Control software may be coded in any suitable compute readable programming language.

In some embodiments, the control software may include input/output control (IOC) sequencing instructions for controlling the various parameters described above. Other computer software and/or programs stored on mass storage device and/or memory device associated with the controller 430 may be employed in some embodiments. Examples of programs or sections of programs for this purpose include a process gas control program, a pressure control program, and RF source control programs.

A process gas control program may include code for controlling gas composition (e.g., deposition and treatment gases as described herein) and flow rates and optionally for flowing gas into a chamber prior to deposition to stabilize the pressure in the chamber. A pressure control program may include code for controlling the pressure in the chamber by regulating, for example, a throttle valve in the exhaust system of the chamber, a gas flow into the chamber, etc. A RF source control program may include code for setting RF power levels applied to the electrodes in accordance with the embodiments herein.

In some embodiments, there may be a user interface associated with the controller 430. The user interface may include a display screen, graphical software displays of the apparatus and/or process conditions, and user input devices such as pointing devices, keyboards, touch screens, microphones, etc.

In some embodiments, parameters adjusted by controller 430 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 430 from various process tool sensors. The signals for controlling the process may be output on the analog and digital output connections of the plasma etch chamber. Non-limiting examples of sensors that may be monitored include mass flow controllers, pressure sensors (such as manometers), thermocouples, etc. Appropriately programmed feedback and control algorithms may be used with data from these sensors to maintain process conditions.

The controller 430 may provide program instructions for implementing the above-described directional deposition processes as well as subsequent etch processes. The program instructions may control a variety of process parameters, such as RF bias power level, pressure, temperature, etc. The instructions may control the parameters to directionally deposit mask-build up films according to various embodiments described herein.

A controller 430 will typically include one or more memory devices and one or more processors configured to execute the instructions so that the apparatus will perform a method in accordance with disclosed embodiments. Machine-readable media including instructions for controlling process operations in accordance with disclosed embodiments may be coupled to the controller 430, for example as describe above.

In some implementations, the controller 430 may be or form part of a system controller that is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller, in some implementations, may be a part of or coupled to a computer that is integrated with, coupled to the system, otherwise networked to the system, or a combination thereof. For example, the system controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller receives instructions in the form of data, which specify parameters for each of the processing steps to be performed during one or more operations. It should be understood that the parameters may be specific to the type of process to be performed and the type of tool that the system controller is configured to interface with or control. Thus as described above, the system controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In some embodiments, the PECVD deposition may employ a remote, radical-assisted plasma or a microwave plasma. Such a deposition may be performed in an etch chamber configured with a remote or microwave plasma generator or may be performed in a deposition chamber connected under vacuum to an etch chamber. Similarly, in some embodiments, a treatment operation may be performed using a remote radical-assisted plasma or a microwave plasma.

Example process parameters are given as follows. Example pressure ranges are from 5 mT to 1000 mT, and in some embodiments, between 40 mT to 100 mT. In a treatment operation, example pressures may range from 5 mT to 300 mT.

Example plasma powers for an inductively coupled plasma source (e.g., a transformer coupled plasma (TCP) source available from Lam Research, Fremont California is 10 W to 1200 W, 20 W to 500 W, or 50 W to 300 W. Example plasma powers for a deposition operation range from 20 W to 200 W. Example plasma powers for a treatment operation range from 20 W to 1200 W.

Example bias voltages range from 0 V to −500 V, 0 to −80 V, for example −50 V. Bias voltage may also be expressed in terms of magnitude, e.g., 0 to 500 V, 0 to 80 V, or 0 to 50 V. Example flow rates at the deposition step range from 1 sccm to 2000 sccm, from 1 to 300 sccm, or 100 sccm. Example flow rates at the treatment step range from 1 to 2000 sccm, 1 to 500 sccm, or 300 sccm. Example substrate temperatures range from 40° C. to 250° or 60° C. to 120° C. Deposition and treatment exposure time may range from 0.5 s to 20 s in some embodiments, or from 3 s to 10 s, or 4 s to 6 s, with an example of a process time for the multi-cycle process. In some examples, between 10 and 100 cycles are performed.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

The invention claimed is:

1. A method comprising:
   providing to a process chamber a substrate comprising a patterned mask layer disposed on a target layer to be etched, the target layer comprising a first material etched at a first etch rate using a first chemical species, and the patterned mask layer comprising a second material etched at a second etch rate using the first chemical species, wherein the first etch rate is higher than the second etch rate;
   depositing on a portion of the patterned mask layer a sacrificial layer comprising a third material;
   after depositing on the portion of the patterned mask layer the sacrificial layer, etching the patterned mask layer and the sacrificial layer using a second chemical species, wherein the sacrificial layer inhibits etching of the portion of the patterned mask layer covered by the sacrificial layer, wherein after etching the patterned mask layer and the sacrificial layer the substrate comprises a patterned target layer; and
   after etching the patterned mask layer and the sacrificial layer, etching the patterned target layer and the sacrificial layer using the first chemical species, wherein the third material of the sacrificial layer is etched at a third etch rate using the first chemical species that is higher than the second etch rate.

2. The method of claim 1, wherein the first material and the third material are similar.

3. The method of claim 2, wherein the third material has a chemical composition that is at least 50% the same by molar percent as the first material.

4. The method of claim 2, wherein the third material has a chemical composition that is at least 75% the same by molar percent as the first material.

5. The method of claim 2, wherein the third material has a chemical composition that is at least 90% the same by molar percent as the first material.

6. The method of claim 1, wherein the third etch rate is the same as the first etch rate within 50%, inclusive.

7. The method of claim 6, wherein the third etch rate is the same as the first etch rate within 10%, inclusive.

8. The method of claim 1, wherein the second material is etched at an etch rate using the second chemical species that is higher than the etch rates of the first material and the third material etched using the second chemical species.

9. The method of claim 1, further comprising depositing on the patterned mask layer additional second material prior to depositing the sacrificial layer.

10. The method of claim 1, further comprising depositing on the patterned mask layer additional second material after depositing the sacrificial layer.

11. The method of claim 1, wherein the depositing on the patterned mask layer comprises a plasma enhanced chemical vapor deposition (PECVD) process.

12. The method of claim 1, wherein the depositing on the patterned mask layer comprises a high density plasma chemical vapor deposition (HDP-CVD) process.

13. The method of claim 1, wherein the depositing and etching are done within the same process chamber.

14. The method of claim 1, wherein the second material is a $SiO_2$-based or SiN-based material and the first material and third material are silicon-based materials.

15. The method of claim 1, wherein the second material is a SiON-based material and the first material and third material are carbon-based materials.

16. The method of claim 1, wherein the second material is a carbon-based material and the first material and third material are a $SiO_2$-based or SiON-based materials.

17. The method of claim 1, wherein the second material is a silicon-based material and the first material and third material are a $SiO_2$-based or SiN-based materials.

18. The method of claim 1, wherein the second material is a $SiO_2$-based or SiN-based material and the first material and third material are tungsten-based materials.

19. A method for mask reshaping, comprising:
   providing to a process chamber a substrate comprising a patterned mask layer disposed on a target layer to be etched, the target layer comprising a first material etched at a first etch rate using a first chemical species, and the patterned mask layer comprising a second material etched at a second etch rate using the first chemical species, wherein the first etch rate is higher than the second etch rate;
   depositing on a portion of the patterned mask layer a sacrificial layer comprising a third material;
   after depositing on the portion of the patterned mask layer the sacrificial layer, etching the patterned mask layer and the sacrificial layer using a second chemical species, wherein the sacrificial layer inhibits etching of the portion of the patterned mask layer covered by the sacrificial layer, wherein after etching the patterned mask layer and the sacrificial layer the substrate comprises a patterned target layer; and
   after etching the patterned mask layer and the sacrificial layer, etching the patterned target layer and the sacrificial layer using the first chemical species, wherein the third material of the sacrificial layer is etched at a third etch rate using the first chemical species that is higher than the second etch rate,
   wherein the first material, the second material, and the third material are selected from one of the following combinations:
   the second material is a $SiO_2$-based or SiN-based material and the first material and third material are silicon-based materials;
   the second material is a SiON-based material and the first material and third material are carbon-based materials;
   the second material is a carbon-based material and the first material and third material are a $SiO_2$-based or SiON-based materials;
   the second material is a silicon-based material and the first material and third material are a $SiO_2$-based or SiN-based materials; or
   the second material is a $SiO_2$-based or SiN-based material and the first material and third material are tungsten-based materials.

* * * * *